US008792527B2

(12) United States Patent  
Grove

(10) Patent No.: US 8,792,527 B2
(45) Date of Patent: *Jul. 29, 2014

(54) MOUNT FOR SEMICONDUCTOR DEVICES USING CONFORMABLE CONDUCTIVE LAYERS, AND METHOD

(75) Inventor: Robert E. Grove, Pleasanton, CA (US)

(73) Assignee: Intellectual Light, Inc., Pleasanton, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/598,542

(22) Filed: Aug. 29, 2012

(65) Prior Publication Data

US 2013/0058367 A1  Mar. 7, 2013

Related U.S. Application Data

(63) Continuation of application No. 13/476,762, filed on May 21, 2012.

(60) Provisional application No. 61/528,747, filed on Aug. 29, 2011.

(51) Int. Cl.
*H01S 3/04* (2006.01)

(52) U.S. Cl.
USPC .............................. 372/34; 372/36

(58) Field of Classification Search
USPC ...................................... 372/36, 34
See application file for complete search history.

(56) References Cited

U.S. PATENT DOCUMENTS

| 6,061,374 | A | 5/2000 | Nightingale et al. |
| 6,130,502 | A | 10/2000 | Kobayashi et al. |
| 6,352,873 | B1 | 3/2002 | Hoden |
| 7,170,919 | B2 | 1/2007 | Zamel et al. |
| 7,189,012 | B2 | 3/2007 | Kuhara et al. |
| 7,215,690 | B2 * | 5/2007 | Valiente .......................... 372/36 |
| 7,366,215 | B2 | 4/2008 | Aruga |
| 7,777,247 | B2 | 8/2010 | Loh et al. |
| 8,340,144 | B1 * | 12/2012 | Grove .............................. 372/34 |
| 2005/0047460 | A1 | 3/2005 | Go et al. |
| 2007/0115617 | A1 | 5/2007 | Schulte et al. |
| 2011/0128987 | A1 * | 6/2011 | Liu ............................... 372/50.1 |
| 2011/0133236 | A1 * | 6/2011 | Nozaki et al. ................... 257/98 |

* cited by examiner

*Primary Examiner* — Kinam Park

(74) *Attorney, Agent, or Firm* — James E. Eakin

(57) ABSTRACT

Mount for semiconductor laser devices comprises thermally conductive anode and cathode blocks on either side of semiconductor laser device such as laser diode. Interposed between at least the anode block and the anode of the semiconductor laser device is a sheet of conformable electrically conductive material with high thermal conductivity such as pyrolytic highly-oriented graphite. In some embodiments, a second sheet of such electrically and thermally conductive conformable material is interposed between the cathode of the semiconductor laser device and the cathode block. The semiconductor laser device can be either a single laser diode or a diode bar having a plurality of emitters. A thermally conductive, but electrically insulating, spacer of essentially the same thickness as the laser diode or bar surrounds the diode or bar to prevent mechanical damage while still permitting the conformable material to be maintained in a compressed state and directing current through the laser device.

33 Claims, 6 Drawing Sheets

MOUNT FOR SEMICONDUCTOR DEVICES USING CONFORMABLE CONDUCTIVE LAYERS, AND METHOD

RELATED APPLICATION

This application is a conversion of U.S. Patent Application Ser. No. 61/528,747, filed Aug. 29, 2011, and a divisional of U.S. patent application Ser. No. 13/476,762, filed May 21, 2012, both of which are incorporated herein by reference, and claims the benefit of each of the foregoing applications.

FIELD OF THE INVENTION

This invention relates generally to methods and apparata for mounting semiconductor devices, and more particularly relates to methods and apparata for mounting of light-emitting semiconductor devices such as laser diodes and the like.

BACKGROUND

Light-emitting semiconductor devices have been developed over the past several decades to emit either incoherent light (devices referred to as "LED's") or coherent light (referred to as "laser diodes" or "diode lasers".) A common attribute of both LED's and laser diodes is a pair of electrically conducting surfaces, serving as the anode and cathode of the device, through which an electrical current is passed to generate light. In devices where a high optical output is desirable (e.g., in some LED lighting applications and especially in high-power laser diodes), a critical aspect of the device mounting relates to the ability of such mounting to effectively remove waste heat from the device. This is of particular importance where high power, high efficiency and high reliability are desired, since all light-emitting semiconductor devices exhibit declining electrical-to-optical efficiency as the diode temperature increases; and ultimately succumb to catastrophic failure if the diode temperature continues to rise, either with prolonged emission or at higher current levels.

Both LED's and laser diodes are of remarkably small size given the amount of light these devices can emit, the amount of power they consume, and the amount of heat that they generate. By way of example, a single laser diode "chip" emitting laser light at 1470 nm (Seminex Corporation, Peabody, Ma.) can readily produce four watts of continuous-wave laser emission with an input current of ten amperes and a voltage drop of about two volts (an input electrical power of 20 watts, resulting in an efficiency of 20%). The dimensions of this chip are only 0.5 mm wide by 2.5 mm in length, with a thickness of 0.16 mm. Even more remarkably, the actual laser light is emitted by a very thin, narrow region centered on the anode surface (the so-called "P-side") that is only 95 microns (0.095 mm) wide and 1 micron in height. This "laser stripe" on the P-side has a surface area of 0.095 mm by 2.5 mm, or 0.24 mm$^2$. Since in the above example 80% of the input electrical power becomes waste heat, the power density on the laser stripe surface exceeds an enormous 6,000 watts per square centimeter. This represents a significant amount of thermal energy that must be efficiently conducted away from the laser diode to avoid overheating or catastrophic failure.

To maximize the conduction of heat away from a hot surface, the thermal conductivity between the hot surface and the cooler contacting surface must be maximized. Two approaches have generally been used: either mechanically pressing the heatsink against the hot surface (often with an interface substance such as "thermal grease" placed in between the two surfaces); or by bonding the two surfaces together with a solder, or glue such as a high-thermal conductivity epoxy. The mechanical approach has not proved practical with semiconductor devices such as laser diodes, for two reasons. First, the laser itself has no casing or housing, and the laser material is quite brittle. Thus, the pressure necessary to achieve good thermal conductivity using a hard heat sink surface can result in cracking of the semiconductor device, either immediately or during use. Secondly, while thermal grease can help achieve high thermal conductivity with a lighter pressure, the grease tends to migrate toward the optical surfaces of the laser diode, resulting in permanent damage to the laser.

Solder bonding has thus been used more frequently for semiconductor devices such as laser diodes, since it offers good thermal conduction to a heatsink, typically better than an epoxy, without putting direct mechanical pressure on the brittle diode material. However, this approach has its own inherent drawbacks, especially for laser diodes, which are typically fabricated out of gallium arsenide or indium phosphide. A simple soldering to a copper heatsink routinely fails due to the difference in the thermal expansion coefficient between the laser diode material and the heatsink material. To overcome this problem, more difficult to fabricate (and expensive) heatsink material must be used, having a comparable thermal expansion coefficient. Because the thermal expansion coefficient of solder is also not perfectly matched to that of the semiconductor, it too places stresses on the laser diode.

A related challenge for soldering is that the laser diode has an output facet coating consisting of a partially-transmitting, multilayer dielectric material, and a highly reflective coating on the rear laser facet. Both of these optical surfaces must be completely undisturbed during the soldering process, or the laser will likely fail. Thus, many fluxes that might typically be used to remove oxides during the soldering process cannot be used.

In addition, it is desirable to subject laser diodes to minimal temperature rise during soldering, but low melting-point solders such as indium and its alloys do not generally "wet" surfaces as well as higher temperature solders. This requires that the laser diode surface be designed to be as "solderable" as possible. Thus the metallization on the P-side is typically a "sandwich" of vacuum-deposited layers consisting of for example, a 50-nanometer layer of titanium, followed by a 125-nm layer of platinum, and covered finally with a 250-nm layer of gold.

Still further, the solder must be in intimate contact with the entire length of the laser stripe; if it is not, the region without contact becomes catastrophically hot. Unfortunately, when the optical coating is deposited onto the output facet of the laser diode chip, some of the coating material may get inadvertently deposited on the P-side of the chip and prevent the solder from bonding to the chip in that area. This typically results in infant failure of the chip. A common reason for rejecting laser chips prior to solder-mounting to a heat sink is such facet coating "overspray."

Lastly, as a final additional complexity of some commercially-mounted laser diodes, as many as 6 to 12 microscopic gold wires are individually ball-bonded onto the cathode surface of the laser diode, for the purpose of providing a return current path from the laser device.

From the foregoing, it will be appreciated that there has long been a need for a method of mounting semiconductor devices such as laser diodes that provides the desired thermal and optical performance while being simpler and more reliable to manufacture and assemble.

SUMMARY OF THE INVENTION

The present invention provides the aforementioned improvements by providing apparata that are simpler to manufacture than the prior art while providing excellent heat conduction away from the semiconductor device, and also providing optical performance similar to that achieved with laser diodes soldered to a heatsink.

In an embodiment, the apparatus of the present invention comprises a sandwich of a pair of partially compressible, thermally conductive graphite sheets with a spacer therebetween. In the spacer is a slot essentially matched in size (length and width) to a laser diode, which is positioned within the slot when the assembly is complete. In an embodiment, the spacer is equal to or slightly thinner than the height of the semiconductor device, to ensure adequate contact between the graphite sheets and the semiconductor. The graphite sheets are then compressed by any suitable means into good thermal and electrical contact with the laser diode, with the spacer preventing undue mechanical stress on the laser diode. Because the graphite sheet is compressible and much softer than the spacer or the semiconductor, uniform modest pressure can be applied to the laser diode without breaking the laser diode chip.

In an embodiment, the assembly is held together with screws and the "sandwich" of the cathode and anode plates are compressed by the mechanical force of the screws. Alternatively, the assembly can be glued together, for example using a UV-cured epoxy, in which case the components are placed together and then suitably compressed in advance of gluing, and held in compression until the glue is suitably cured or otherwise set. The glued embodiment is particularly well-suited to automated assembly, although automated assembly is possible with many other embodiments.

In an alternative embodiment, multiple slots are provided in the spacer. In a further alternative embodiment, a plurality of graphite sheets are stacked with a plurality of spacers therebetween, and laser diodes positioned in the slots in each spacer. The multilayer sandwich thus formed permits an array of semiconductor devices to be assembled reliably and at relatively low cost compared to the prior art.

THE FIGURES

DETAILED DESCRIPTION OF THE INVENTION

Figure 1:
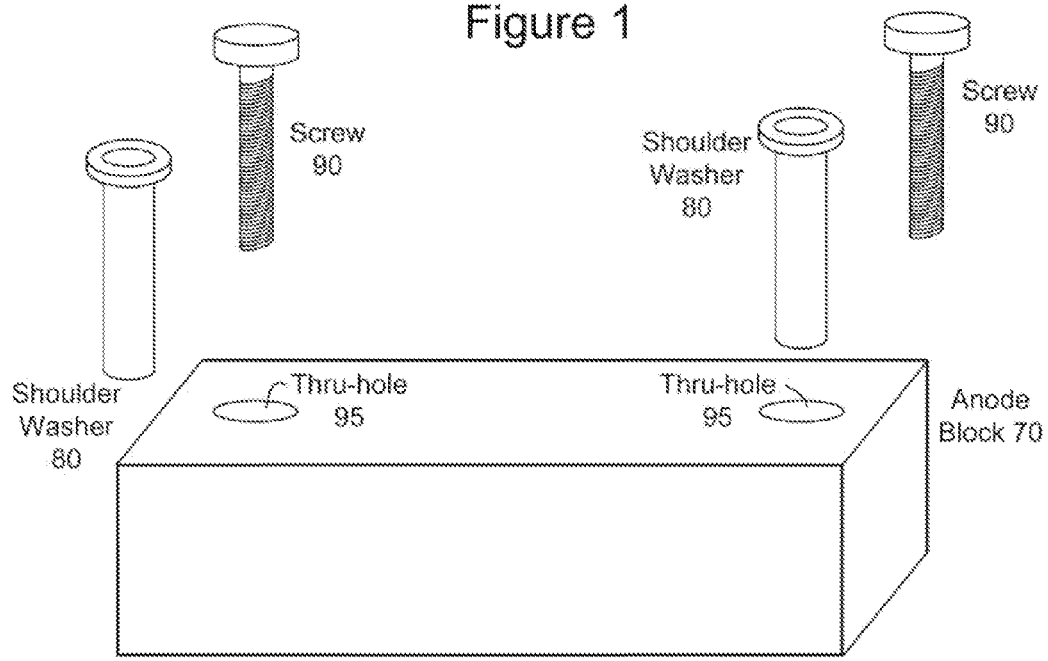
FIG. 1 illustrates in exploded view an embodiment of a device in accordance with the invention.
Figure 1:
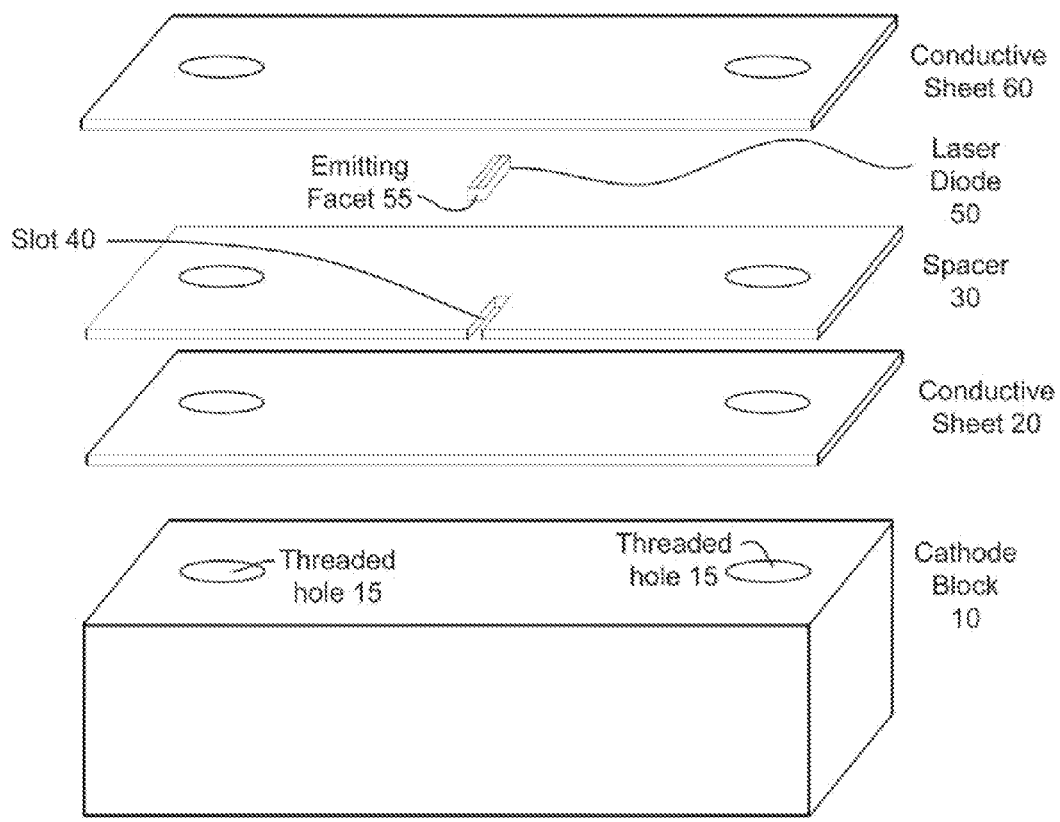

Referring to FIG. 1, an embodiment of a device in accordance with the invention is shown in an exploded view. In such an embodiment, the device can be of generally rectangular shape, of dimensions nominally 0.5 inch wide by 0.25 inch deep by 0.25 inch in thickness. It will be appreciated that these dimensions and shapes are exemplary only, and are largely a matter of design choice. Thus, the dimensions and shapes shown and described herein are not intended to be limiting. For example, the entire device could be made much smaller by simply utilizing screws smaller than the 0-80 size contemplated in the drawing, or by using glue as discussed in connection with the embodiment of FIG. 4. Similarly, the shape can be altered to any convenient form, as long as sufficient compression is provided to ensure reliable mechanical placement as well as thermal and electrical conductivity among the various components, together with sufficient heat removal.

In the embodiment shown in FIG. 1, a cathode block 10 is comprised of an electrically and thermally conductive material such as copper or the like. A pair of threaded holes 15 is positioned essentially near the outer perimeter of the block, although the particular location is not critical, and other fastening mechanisms can be used. A first electrically and thermally conductive sheet 20 is positioned above the cathode block 10, and a spacer 30 is positioned above the sheet 20. The spacer 30 is electrically insulating, and preferably will be thermally conductive in at least some embodiments. Further, for some embodiments, it is desirable that the spacer have thermal conductivity of at least 50 watts per meter-degree Kelvin (50 W/m-deg K), which can be achieved with, for example, a copper sheet having a Mylar layer bonded thereto, or a copper sheet having at least one of the top or bottom surfaces coated with insulating varnish or polyurethane, or anodized aluminum, or aluminum coated similarly to copper. In some embodiments where the spacer is metal with a single insulating layer such as Mylar, it may be desirable to place the bare metal surface against the PGS sheet closest to the anode block. In general, the spacer will preferably have high thermal conductivity, ease of fabrication, and low cost. Thus, in other embodiments, a thermally conductive plastic material, or composites with high thermal conductivity particles mixed in, or ceramic-like materials with good thermal conductivity such as beryllium oxide or boron nitride, or other metals combined with an insulating layer, can be acceptable for the spacer.

A slot 40 extends inwardly from the near edge of the spacer 30, and has dimensions essentially intended to match laser diode 50, with the thickness of the spacer 30 substantially the same as the thickness, or height, of the laser diode 50. The emitting facet 55 of the laser diode is positioned at the open end of the slot, allowing laser light to exit the edge-emitting device in the intended manner. In some embodiments, the laser diode 50 can comprise a bar having multiple stripes or emitters, for example two to twenty-five stripes, such that light is emitted from multiple locations.

Figure 3:
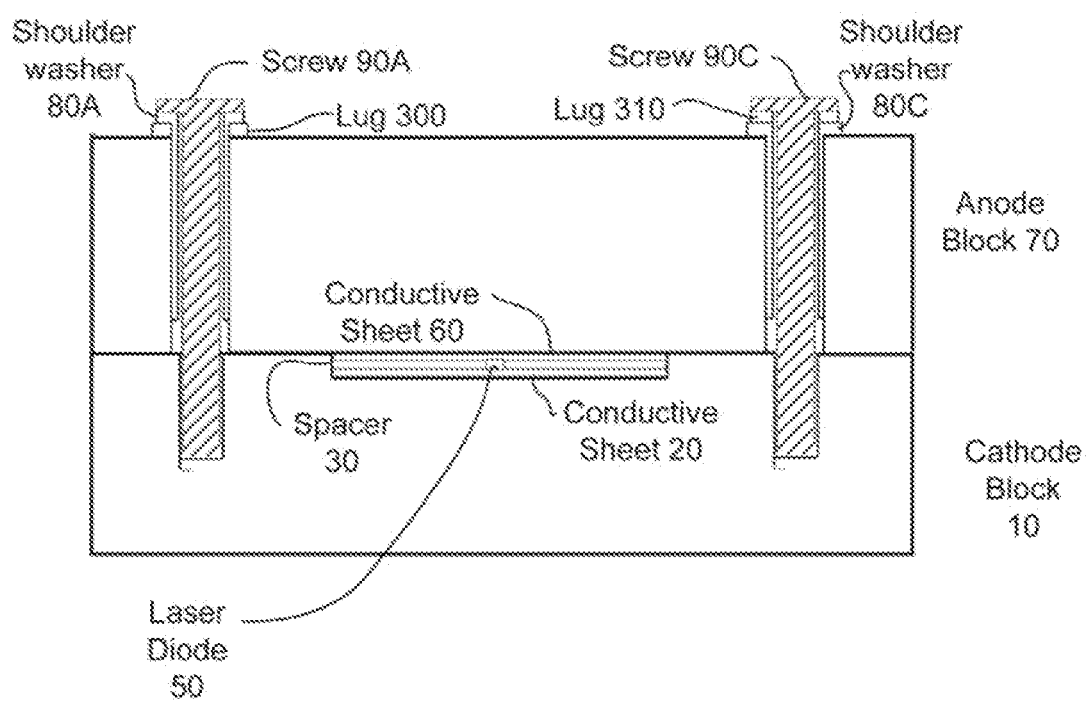
FIG. 3 illustrates in cross-sectional side view an assembled version of the device shown in FIG. 2.

A second conductive sheet 60 is positioned above the spacer 30 and laser diode 50, when the laser diode is positioned within the slot 40. An anode block 70 is positioned above the second conductive sheet 60. The assembly can be clamped together by any convenient means, such as electrically insulating shoulder washers 80 and electrically conductive bolts or screws 90, and for this purpose holes 95 are provided in each of the conductive sheets and the spacer. As noted above, other fastening approaches can be used, such as glue, insulated spring clips or the like. A pair of conductive lugs, not shown in FIG. 1 but visible in the assembly drawing of FIG. 3, provides appropriate electrical connectivity to the anode and cathode blocks.

In the embodiment of FIG. 1, the laser diode is effectively clamped between the anode block and cathode block by virtue of the screws or bolts 90. The conductive sheets 20 and 60 are somewhat compressible, and thus both hold the laser diode in place mechanically as well as forming electrical contact with the laser diode uniformly along the length of the laser diode. An electrically conductive path is formed from the anode, through the first conductive sheet, then through the laser diode, the second conductive sheet, and finally the cathode block. The spacer prevents electrical conductivity except through the laser diode. If desired, shims (not shown) can be provided between the anode and cathode blocks, or integrated with the spacer 30, to prevent excessive clamping force on the laser diode.

The conductive sheets 20 and 60 are preferably formed from pyrolytic highly oriented graphite sheet (sometimes "PGS" or "pyrolytic graphite" hereinafter) such as sold by Panasonic Electronic Devices Co., Ltd. Some formulations of such pyrolytic graphite sheets, such as those currently sold by Panasonic, provide better thermal conductivity if compressed. Thus, in some embodiments, the sheets 20 and 60 are preferably compressed about fifteen to forty or more percent (nominally ~25% in some embodiments, while in other embodiments ~35% is preferred) to ensure good thermal conductivity, although the amount of compression can be adjusted over a wide range, from about five percent to about forty-five percent, depending upon the embodiment and particularly the amount of heat generated, the magnitude of the acceptable voltage drop across the assembly, and the nature of the thermal pulse applied to the PGS material. Within the range of five percent to about forty-five percent compression, greater compression results in less voltage drop. In an embodiment, with compression of approximately thirty-five percent, the voltage drop across the assembly of the present invention is substantially similar to the voltage drop across a soldered assembly, or between about 1.2 and about 1.5 volts. The thickness of the sheets 20 and 60 need not be the same (more heat is generated on the anode side of the laser diode). It should be noted that the actual thermal conductivity of PGS material increases as the sheet becomes thinner. Thus, for example, designs which generate relatively more heat, and do so more quickly, may benefit from relatively thin sheets on the anode side, whereas a different thickness may be preferred for other designs using with different thermal pulse shapes. In general, a clamping force of approximately 6 kg/m$^2$ provides adequate compression for the embodiment described, although in other implementations a range of 1-30 kg/m$^2$ will be acceptable, with a range of 4-8 kg/m$^2$ generally preferred. In some embodiments, including those involving higher power or longer pulse duration, it may be desirable to reduce electrical contact resistance between the laser diode and the PGS material, particularly on the anode side. For such embodiments, the surface of the PGS material that contacts the light emitting device can be plated by any convenient means, such as electroplating or vapor deposition, with a conductive material such as copper or gold. Alternatively, a thin sheet of such conductive material can be placed between the laser diode and the PGS material. In other embodiments, the surface that contacts the cathode side of the light emitting device can also be coated, and, in still other embodiments, both top and bottom of the PGS material can be coated. The conductive material is preferably plated to a thickness of 0.2 to 25 microns, with a thickness of 1-10 microns being generally preferred. The metal layer on the PGS material is sufficiently thin that the PGS material remains compliant with the associated block (anode or cathode) as well as the light emitting device.

The sheets 20 and 60, made from such PGS material, offer lateral thermal conductivity (W/mK) ranging from 600 to 1800 for thicknesses ranging from 100 μm to 17 μm, respectively. Vertically, or in the Z direction, the thermal conductivity of such PGS material is about 15 W/mK, or roughly equivalent to the thermal conductivity of various solders as would be used in a solder-mounting of laser diodes, with higher conductivity being preferred. Advantageously, it will be appreciated that, in the present invention, it is not necessary to have multi-layer metallized surfaces on the laser diode, as is generally required for solder mounting. Instead, in at least some embodiments, the conductive sheets 20 and 60 can simply be placed in direct contact with an unmetallized laser diode to achieve proper current flow. The graphite material also has excellent electrical conductivity, comparable to indium, lead or tin. It should be noted, however, that the novel design of the invention described herein is not intended to be limited to the incorporation of pyrolytic graphite, but rather encompasses the use of other very high thermal conductivity, compressible materials with good electrical conductivity as well.

The present invention is well-suited to applications requiring laser diodes or diode bars operating in the range of 400 nm to 2000 nanometers, with drive currents from 0.5 to 20 amperes, pulse durations from one millisecond to one second, and duty factors as high as fifty percent. In pulsed mode, the present invention can be operated in either a single pulse mode or a repetitively pulsed mode. In an exemplary embodiment, the device can be operated with five millisecond pulses at a pulse repetition rate of 30 Hz, corresponding to a duty factor of fifteen percent. For a drive current of ten amperes, the output power of each pulse is about four watts. For a pulse duration of about five milliseconds, this produces a pulse energy of about 30 millijoules. In some embodiments, continuous operation can be used for up to one second. Alternatively, pulsed operation can be used with pulses of up to one second with a duty cycle of 50 percent, effectively providing a cool down period of about one second between pulses of about one second. As a further alternative, sufficiently increasing the effective contact surface area between the laser diode chip and the conductive sheets may permit continuous operation for longer periods, or longer pulses, or increased duty cycles.

Figure 2:
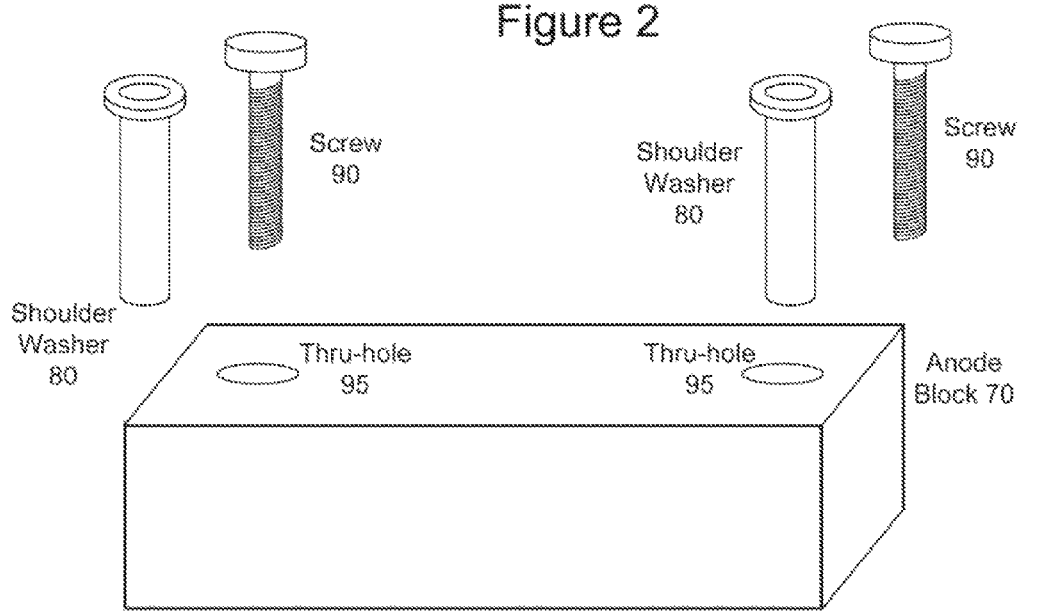
FIG. 2 illustrates in exploded view an alternative embodiment of a device in accordance with the invention.
Figure 2:
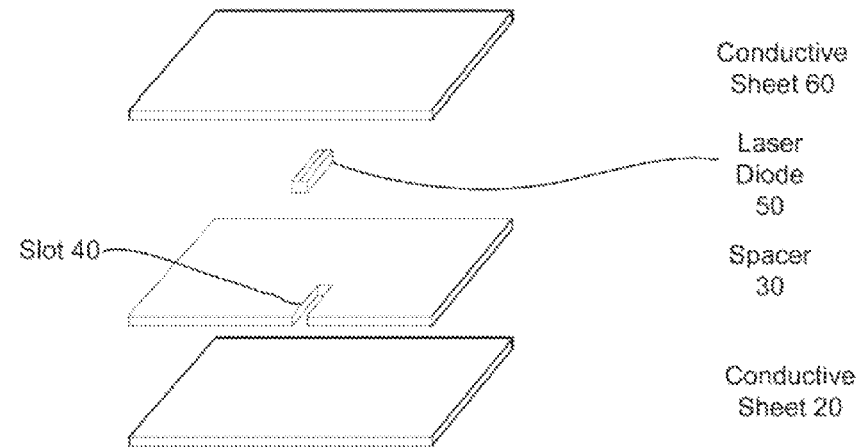
Figure 2:
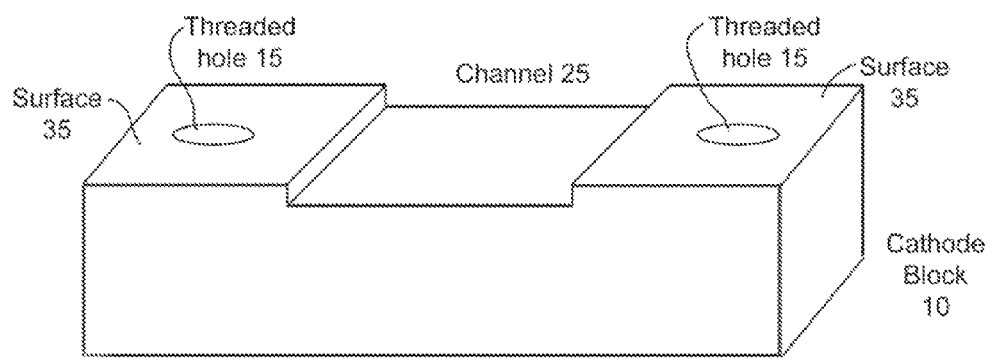

FIG. 2 illustrates an alternative, and presently preferred, embodiment where a single laser diode device is used. Elements substantially similar to those in FIG. 1 are designated by like numerals. In the embodiment of FIG. 2, cathode block 10 is typically machined out of copper, with a channel 25 milled at a convenient location, for example, in its center, resulting in surfaces 35 on either side of the channel 25. Channel 25 is machined to a depth such that, when surfaces 35 contact the anode block 70, the PGS sheets 20 and 60 undergo approximately 25% compression. This depth can be, for example, 10 mils, depending on the dimensions of the diode 50 and the thickness of the PGS sheets. At roughly 25% percent compression most of the thermal performance of the PGS material is achieved, while providing sufficient clamping force both to ensure good electrical connection and to ensure that the diode 50 does not move, while at the same time limiting the pressure on the diode 50 to avoid damage. In an embodiment, the clamping force to provide appropriate compression of the sheets 20 and 60, and to fixedly clamp the laser diode or other semiconductor, can range from about 1-30 kg/m$^2$, although in most designs a range of 4-8 kg/m$^2$ will be acceptable. In some embodiments, surfaces 35 of the cathode block are sprayed with a few tenths of a mil of an electrically insulating substance, such as common polyurethane. This avoids electrical shorting of the cathode block 10 to the anode block 70, and forces electrical current to pass through the laser diode chip 50. In an alternative embodiment, a thermally conductive but electrically insulating spacer 30 (such as a copper sheet with a bonded Mylar layer) extends laterally to cover surfaces 35 of the cathode block shown in FIG. 2. This eliminates the need for spraying an electrically insulating layer directly onto these surfaces of the cathode block.

For assembly, a piece of PGS material 20, for example of a thickness of four mils and dimensions of approximately ¼ inch by 3/16 inch, is placed in the channel 25. A spacer 30, equal in thickness to that of the laser diode chip 50 (nominally 6 mils), is then placed on top of the PGS sheet 20. A laser diode chip 50 is then placed in slot 40 of spacer 30. Laser diode chip 50 is oriented such that its laser emission propagates out through emission facet 55 and out of the assembly when current is applied. The chip 50 is also oriented such that the P-side is upward in the figure, so that the laser stripe is facing toward the anode block 70 for proper current flow.

A second sheet of PGS 60, approximately one mil thick, is then placed on top of the chip 50 and spacer 30, followed by the anode block 70. To complete the assembly, machine screws 90 are slid through insulating shoulder washers 80 and then through thru-holes 95; and threaded into threaded holes in the cathode block 10. Because of the innovative design of this compression mount assembly, the pressure on the laser diode chip 50 is essentially independent of the torque applied to the machine screws. That is, once surfaces 35 of the cathode block 10 press against the anode block 70, the total gap distance of channel 25 is essentially independent of the torque applied to the machine screws, resulting in simple and reliable assembly, substantially the same as the shims discussed in connection with FIG. 1.

To drive electrical current through the assembled compression mount, and more particularly through the laser diode, reference is made to FIG. 3, which illustrates the same embodiment as shown in FIG. 2, but this time in cross-section. To make the anode electrical connection, machine screw 90A is placed through insulating shoulder washer 80A, which in turn rests on anode ring lug 300 atop anode block 70. Anode ring lug 300 is the termination of the electrical wire, and associated circuitry (not shown) providing current to the assembly. Because anode ring lug 300 rests on anode block 70, electrical connection is made. Machine screw 90A is then threaded into cathode block 100.

The return current path is formed in an analogous manner. Machine screw 90C is placed through cathode ring lug 310, and then through insulating shoulder washer 80C. Because machine screw 90C is threaded into cathode block 10 as well, the screw itself is at cathode potential, providing a return current path through cathode ring lug 310 to the electrical wire returning current from the assembly.

In testing, the embodiment described above in connection with FIG. 2, using a thermally conducting copper spacer coated with a thin electrically insulating layer of polyurethane, offers laser light output substantially equivalent to a conventional mounting (where a laser diode has the P-side soldered to a gold-plated heat sink and has multiple individual gold wire bonds to the N-side) for individual 5-millisecond pulses up to roughly 10 amperes. Similar equivalence has been demonstrated when both devices are operated at significant average power (e.g., at a repetition rate of 30 Hz) for over ten minutes, confirming that the heat transfer from the present invention is equivalent to that of conventional mounts for longer timescales as well. The indicated performance of the present invention offers significant utility. For example, in an embodiment suitable for use in a fractional non-ablative device, pulsed current in the range of four to eight amperes, having a pulse duration of five milliseconds, provides an optical output energy of approximately seven to fifteen millijoules. Those skilled in the art will recognize that both current and pulse duration can be varied to adjust the output as desired.

It is noted that the embodiment described herein is intended to serve only as an example of the novel mounting scheme using compression; there are many variations that would perform equally well, and may have their own particular advantages. In one such variation, only one side of the laser diode chip may utilize the pyrolytic graphite or similar material, with the other side rigidly attached. For example, the N-side of the laser diode may be soldered to a copper trace on a conventional printed circuit board. The thinness of the trace provides sufficient mechanical compliance to allow soldering of the chip to copper rather than an expansion-matched copper-tungsten alloy. With the chip soldered to a printed circuit board, other electronic components and/or sensors may be located very close by using conventional PC-board assembly methods. In another embodiment, the P-side of the laser diode chip is placed directly in contact with a polished surface of the anode block; the graphite material in contact with the cathode side of the chip provides the requisite compressibility to avoid cracking the chip. In yet another embodiment, a channel is created in both the anode and cathode block to retain the graphite material conveniently. The channel depths are chosen, along with the thicknesses of the anode and cathode graphite materials, such that the entire assembly, when compressed, compresses each graphite sheet by approximately 25-35%, where increased compression generally results in less voltage drop across the assembly. In some embodiments, particularly where the diode chip is scrupulously cleaned to remove any foreign material from between the chip and the graphite sheet, compression of the graphite sheet of 40% or more can be achieved without cracking the diode chip.

The simplicity, reliability and ease of manufacture of the present invention make this device ideally suited for a high-volume consumer laser device, such as a non-ablative fractional laser. The compression-mounting approach is equally applicable to so-called laser diode bars, in which a plurality of emitters, frequently in the range of 18-20, are located adjacent to each other, all emitting from the side of the diode bar. This type of bar, typically made of gallium arsenide operating at a wavelength of about 800 nm, is used in consumer laser hair removal devices, although many other uses exist for devices using different wavelengths or different semiconductor devices. Many of the above-stated benefits of the current invention are equally applicable to these types of applications. In such an arrangement, the slot 40 is simply widened.

Figure 4:
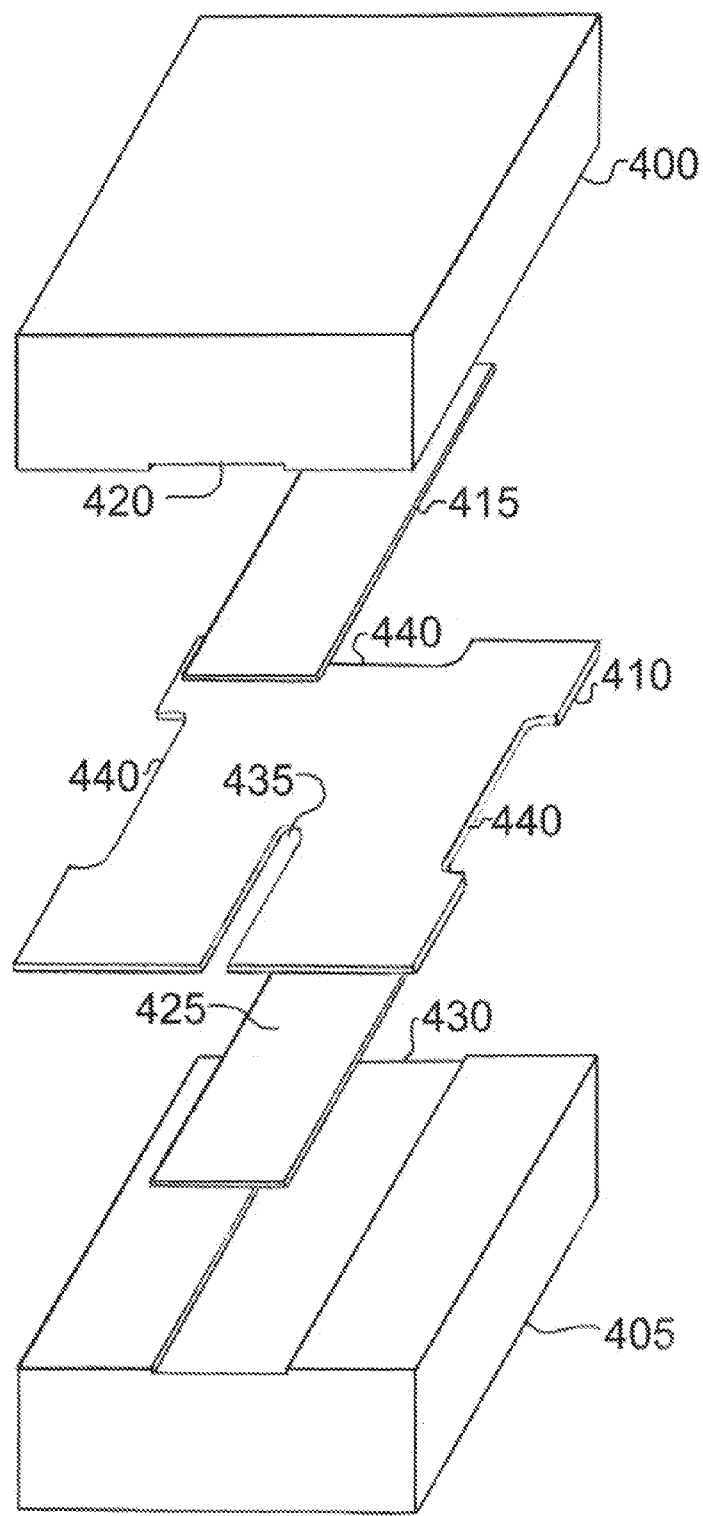
FIG. 4 illustrates an embodiment suitable for assembly by gluing.

Referring next to FIG. 4, a further alternate embodiment is illustrated, wherein the entire assembly is glued together, rather than screwed or bolted together. In an embodiment, small pockets are formed in two or three sides of the assembly where the anode and cathode blocks approach each other (excluding the side emitting the laser light). Glue is then inserted into these pockets and cured, e.g., with a UV-curing cement, a two-part epoxy, a cyanoacrylate-type of cement, etc. If the assembly is glued together, electrical connections can easily be made to the cathode and anode blocks by standard means, such as solder (prior to assembly), for the inflow and outflow of electrical current. During the gluing process, the assembly is maintained under pressure such that the desired amount of compression of the PGS sheets is achieved, and remains so once the glue has cured or set In particular, an anode block 400 is positioned above a cathode block 405, with a spacer 410 positioned therebetween. A sheet of pyrolytic graphite material 415 is positioned between the anode block 400 and the spacer 410, aligned with a channel 420 in the anode block 400. Similarly, a second sheet of pyrolytic graphite material 425 is positioned between the spacer 410 and cathode block 405, aligned with a channel 430 in the cathode block. A slot 435 is placed in the spacer 410 receives the light emitting device (not shown, see FIG. 2), with the thickness of the spacer the same as, or slightly thinner than, the light emitting device, as discussed previously.

The elements shown in FIG. 4 are assembled by any convenient means. For example, the components can be aligned for assembly by mean of a fixture for positioning the cathode block and remaining elements, and then compressing the assembled components by clamping until the spacer contacts the anode and cathode plates. Glue can then be inserted into glue pockets 440 and allowed to set or cure, at which time the clamping is removed. In such an arrangement, it is desirable to use a glue having limited compliance characteristics, or flexibility, to ensure that good contact is maintained between the graphite sheet and the diode chip once the source of the external clamping is removed. The configuration is otherwise substantially identical with that shown in FIG. 2, including the options of plating the PGS material to reduce electrical contact resistance, or using laser diodes having multiple emitters.

It will be appreciated from the teachings herein that the thickness of the sheets 415 and 425 can be of different thicknesses. For example, the sheet 425 on the cathode side can be approximately 100 microns thick, while the sheet 415 on the anode side can be approximately 25 microns thick. For such thicknesses, the depth of channel 420 can be approximately 16-17 microns, while the depth of the channel 430 can be approximately 65-75 microns. Although the size of the cathode and anode blocks is not critical, a workable size is approximately 1 cm×1 cm×0.5 cm, with the sheets of pyrolytic graphite material roughly to scale. The spacer is, as mentioned above, nominally a 5 mil thick copper sheet with a one mil layer of Mylar bonded thereto, and "pockets" nominally 125 mils deep.

In an alternative embodiment, the channel in the anode block is eliminated, and the anode metallization of the light emitting device either rests directly on the polished copper anode block, or rests on a thin (~17-25 micron) sheet of pyrolytic graphite material without a channel.

Figure 5:
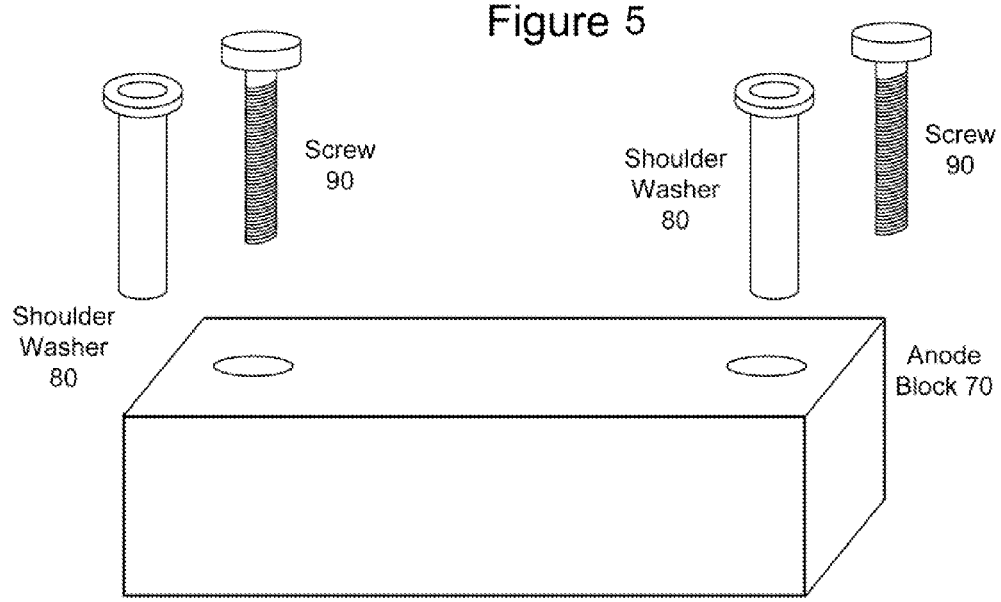
FIG. 5 illustrates in exploded view an alternative embodiment comprising multiple laser diodes arranged in a single layer.
Figure 5:
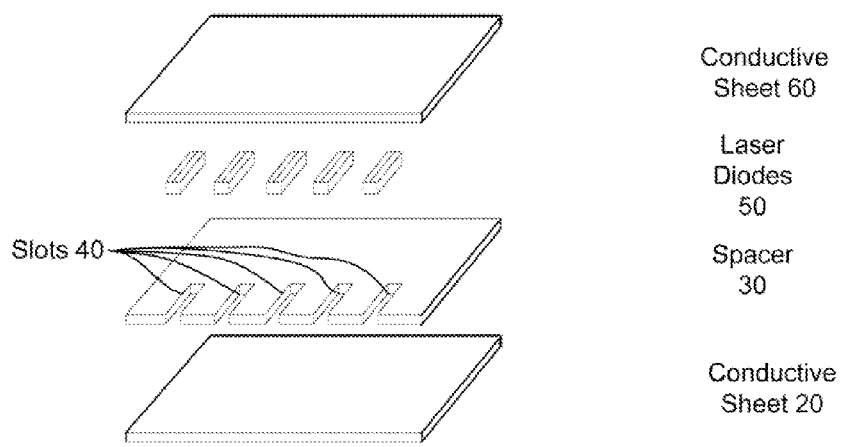
Figure 5:
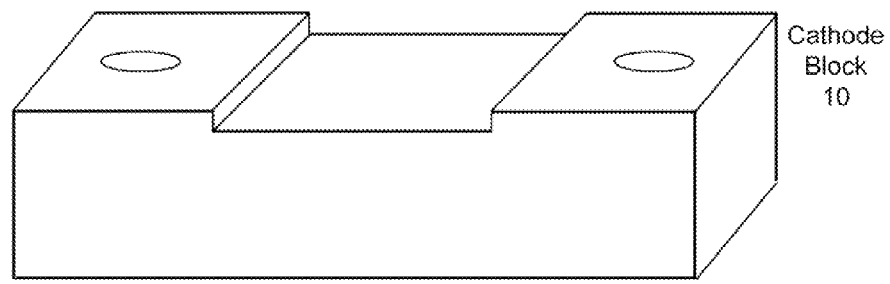

Referring next to FIG. 5, a further alternate embodiment is illustrated, wherein a series of individual laser diodes 50 are separately mounted by means of multiple slots 40 in the thermally conductive but electrically insulating spacer 30. The configuration is otherwise substantially identical with that shown in FIG. 2.

Figure 6:
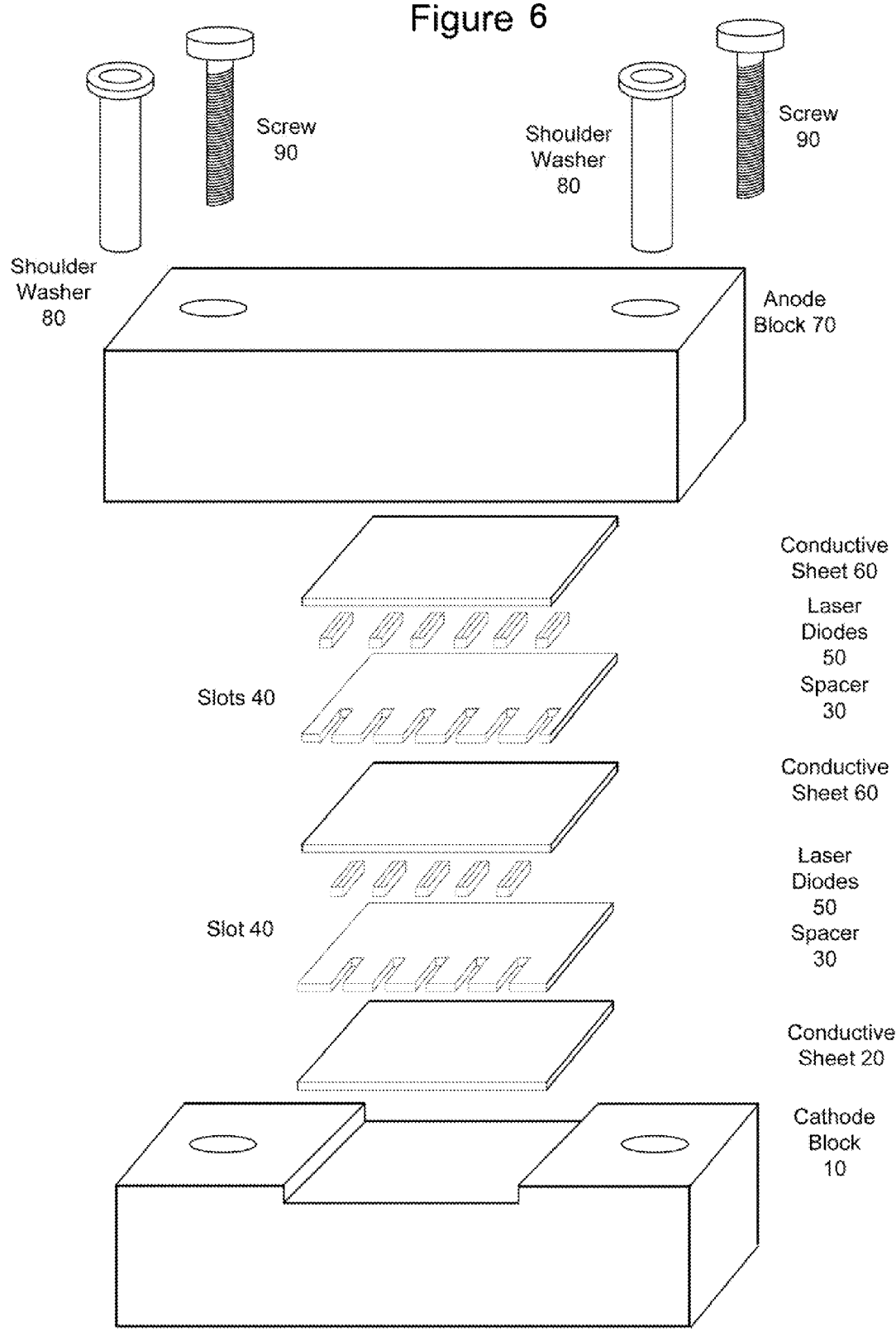
FIG. 6 illustrates in exploded view an alternative embodiment comprising multiple laser diodes arranged in multiple layers.

Referring next to FIG. 6, a still further alternative embodiment is illustrated. In the embodiment of FIG. 6, a plurality a spacers are stacked, each sandwiched between thermally and electrically conductive sheets 60, with thermally and electrically conductive sheet 20 at the bottom of the stack adjacent the cathode block 10. In the embodiment shown, each spacer comprises multiple slots, each adapted to receive a laser diode. Thus, when assembled, the embodiment shown comprises two layers of laser diode devices, with three conductive sheets layered to permit compression mounting of the diode devices. It will be appreciated that the number of diode devices in each layer is a matter of choice depending on the particular design objectives, as is the number of layers. Likewise, diode bars can be used instead of discrete diodes.

As discussed above, a laser diode utilizing a simple compression assembly can enjoy excellent heat conduction away from its surfaces without the complexity and reliability issues associated with a soldered assembly, and without the need for specially prepared metallization coatings such as titanium, nickel and gold on the laser diode anode and cathode surfaces in at least some embodiments.

From the foregoing, it can be appreciated that a new, novel and inventive device, and method of manufacture of such device, has been disclosed. From the foregoing teachings, those skilled in the art will recognize that numerous alternatives and equivalents exist which do not depart from the scope of the invention, and therefore the invention is intended to be limited only by the appended claims.

I claim:

1. An apparatus for generating laser light comprising:
   at least one electrically conducting anode block,
   at least one electrically conducting cathode block,
   at least one semiconductor device having an anode and a cathode, positioned between the anode block and the cathode block;
   a first layer of conformable, compressible material positioned between the anode block and the anode of the semiconductor device, the conformable material being electrically and thermally conductive;
   an electrically insulating layer between the conformable material and the cathode block such that current flowing from the anode block to the cathode block flows only through each of the least one semiconductor device, and
   means for maintaining compression of the conformable material, maintaining electrical and thermal conduction between the anode of the laser device and the anode block through the conformable layer, and maintaining electrical and thermal conduction between the cathode side of each of the at least one semiconductor device and the cathode block.

2. The apparatus of claim 1 wherein the conformable material is a form of pyrolytic graphite sheet.

3. The apparatus of claim 1 wherein the semiconductor device is pulsed and has a pulse duration from one millisecond to one second, and a duty factor less than or equal to fifty percent.

4. The apparatus of claim 1 wherein the semiconductor device is a laser diode and has an output wavelength from 400 nm to 2,000 nm.

5. The apparatus of claim 1 wherein the anode and cathode blocks are thermally conductive.

6. The apparatus of claim 5 wherein the anode and cathode blocks are made of copper.

7. The apparatus of claim 1 wherein the semiconductor device is a laser device comprising from one to three emitters.

8. The apparatus of claim 2 further comprising a second layer of pyrolytic graphite sheet positioned between the cathode of the semiconductor device and the cathode block.

9. The apparatus of claim 2 wherein the means for maintaining compression is glue.

10. The apparatus of claim 2 wherein the means for maintaining compression is screws or bolts.

11. The apparatus of claim 2 wherein the means for maintaining compression is at least one spring clip.

12. The apparatus of claim 2 wherein the electrically insulating layer comprises a thermally conductive spacer having a slot therein for receiving the semiconductor device, and being of substantially the same thickness as the semiconductor device, the spacer being disposed around at least a portion of the sides of the semiconductor device.

13. The apparatus of claim 12 wherein the spacer is thermally conductive plastic.

14. The apparatus of claim 12 wherein the spacer is one of a group comprising beryllium oxide, anodized aluminum, aluminum having an electrically insulating layer, and copper having an electrically insulating layer.

15. The apparatus of claim 1 wherein the compressible material is plated with a material from a group comprising at least copper and gold where the compressible material contacts the anode.

16. Apparatus for removing heat from an edge-emitting light-emitting semiconductor device comprising
a thermally conductive anode block,
a thermally conductive cathode block,
an electrically-insulating, thermally conductive spacer having a slot therein for receiving an edge-emitting light emitting device, the slot being arranged to permit light from the light emitting device to exit the apparatus, the light emitting device having a anode and a cathode and placed in the slot so that the anode is closest to the anode block and the cathode is closest to the cathode block,
a first sheet of pyrolytic highly-oriented graphite interposed between the anode block and at least a portion of an area formed by a combination of the spacer and the anode,
a second sheet of pyrolytic highly-oriented graphite interposed between the cathode block and at least a portion of an area formed by a combination of the spacer and the cathode,
means for maintaining compression of the pyrolytic highly-oriented graphite sheets against the light emitting device to ensure thermal and electrical conductivity therebetween.

17. The apparatus of claim 16 wherein the compression of the graphite sheets is maintained at approximately thirty-five percent.

18. The apparatus of claim 16 wherein the anode block and cathode block are glued together to maintain compression of the graphite sheets.

19. The apparatus of claim 16 wherein the first and second sheets are of different thicknesses.

20. The apparatus of claim 16 wherein the anode block is made of copper.

21. The apparatus of claim 16 wherein the light emitting device comprises from one to three emitters.

22. The apparatus of claim 16 wherein the spacer has a thermal conductivity of at least 50 W/m deg K.

23. Apparatus for mounting a semiconductor laser diode device comprising
a thermally and electrically conductive anode block,
a thermally and electrically conductive cathode block,
an electrically-insulating spacer having a thermal conductivity of at least 50 W/m-deg K, and further having a slot therein for receiving a semiconductor laser diode device having an output wavelength between 400 nm and 2000 nm and operating in pulsed mode with pulses between one millisecond and one second at a duty factor less than fifty percent, the slot being arranged to permit light from the laser diode device to exit the apparatus, the laser diode device having an anode and a cathode and placed in the slot so that the anode is closest to the anode block and the cathode is closest to the cathode block,
a first sheet of pyrolytic highly-oriented graphite interposed between the anode block and at least a portion of an area formed by a combination of the spacer and the anode,
a second sheet of pyrolytic highly-oriented graphite interposed between the cathode block and at least a portion of an area formed by a combination of the spacer and the cathode,
means for maintaining compression of the pyrolytic highly-oriented graphite sheets against the light emitting device to ensure thermal and electrical conductivity therebetween.

24. The apparatus of claim 23 wherein the spacer comprises copper and an electrically insulating layer, and the electrically insulating layer is positioned proximate to the cathode block.

25. The apparatus of claim 23 wherein the spacer comprises at least one of a group comprising anodized aluminum, aluminum and an insulating layer, beryllium oxide, boron nitride, and composites with high thermal conductivity particles integrated therein.

26. The apparatus of claim 23 wherein the first sheet is thinner than the second sheet.

27. The apparatus of claim 23 wherein the duty factor does not exceed twenty percent.

28. The apparatus of claim 27 wherein the laser diode device comprises between one and three emitters.

29. The apparatus of claim 28 wherein the first sheet is plated with a metal in an area where the first sheet contacts the anode.

30. The apparatus of claim 16 wherein channels are formed in the anode block and cathode block for receiving the first and second sheets.

31. The apparatus of claim 1 wherein the semiconductor device is a laser diode bar.

32. The apparatus of claim 1 wherein the semiconductor device is a laser diode and is operated in continuous mode for periods of up to one second.

33. A method for mounting a semiconductor laser device comprising the steps of:
providing an electrically conducting anode block,
providing an electrically conducting cathode block,
providing at least one semiconductor laser device having an anode and a cathode and positioned between the anode block and the cathode block;
providing a first layer of conformable, compressible material positioned between the anode block and the anode of the semiconductor laser device, the conformable material being electrically and thermally conductive;
providing an electrically insulating layer between the conformable material and the cathode block such that current flowing from the anode block to the cathode block flows only through each of the least one semiconductor laser device, and
maintaining compression of anode block relative to the cathode block such that the conformable material is compressed in the range of approximately twenty to approximately forty-five percent.

* * * * *